United States Patent
Lam et al.

(10) Patent No.: US 11,139,044 B2
(45) Date of Patent: Oct. 5, 2021

(54) MEMORY TESTING METHOD AND MEMORY TESTING SYSTEM

(71) Applicant: PHISON ELECTRONICS CORP., Miaoli (TW)

(72) Inventors: Siu-Tung Lam, Hsinchu (TW); Chih-Hung Chiu, Nantou County (TW); Kun-Tsung Lo, Hsinchu (TW); Chao-Kai Zhang, Miaoli County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 65 days.

(21) Appl. No.: 16/150,263

(22) Filed: Oct. 2, 2018

(65) Prior Publication Data

US 2020/0066366 A1 Feb. 27, 2020

(30) Foreign Application Priority Data

Aug. 27, 2018 (TW) .................................. 107129755

(51) Int. Cl.
*G11C 29/42* (2006.01)
*G11C 29/12* (2006.01)
*G11C 29/44* (2006.01)

(52) U.S. Cl.
CPC ........ *G11C 29/42* (2013.01); *G11C 29/12015* (2013.01); *G11C 29/44* (2013.01); *G11C 2029/1204* (2013.01)

(58) Field of Classification Search
None
See application file for complete search history.

(56) References Cited

U.S. PATENT DOCUMENTS 7,730,368 B2 * 6/2010 Murin ................. G11C 11/5621
365/201
8,860,452 B2 * 10/2014 Lee ................... G01R 31/31908
324/756.03

(Continued)

FOREIGN PATENT DOCUMENTS

| CN | 101562052 | | 10/2009 | | |
| CN | 103489485 A | * | 1/2014 | ............. | G11C 29/08 |
| CN | WO2020015132 A1 | * | 7/2018 | ............. | G11C 16/34 |

OTHER PUBLICATIONS

"Office Action of China Counterpart Application", dated Mar. 22, 2021, p. 1-p. 7.

*Primary Examiner* — April Y Blair
*Assistant Examiner* — Matthew W Wahlin
(74) *Attorney, Agent, or Firm* — JCIPRNET

(57) ABSTRACT

A memory testing method and a memory testing system. The memory testing system includes a host system and a testing device. The host system includes a processor. The testing device is coupled to the host system and a rewritable non-volatile memory module. A first memory controlling circuit unit corresponding to a first type memory storage device in the testing device tests the rewritable non-volatile memory module to obtain first test information. A second memory controlling circuit unit corresponding to a second type memory storage device in the testing device tests the rewritable non-volatile memory module to obtain second test information according to the first test information. The processor determines that whether the rewritable non-volatile memory module is applicable to the second type memory storage device or not according to the first test information and the second test information.

22 Claims, 11 Drawing Sheets

(56) References Cited

U.S. PATENT DOCUMENTS

| | | | |
|---|---|---|---|
| 2011/0179324 A1* | 7/2011 | Lai | G11C 29/56008 |
| | | | 714/723 |
| 2012/0198292 A1* | 8/2012 | Yuzurihara | G11C 29/56 |
| | | | 714/718 |
| 2013/0082731 A1* | 4/2013 | Lou | G01R 31/2844 |
| | | | 324/762.01 |
| 2014/0173369 A1* | 6/2014 | Chen | G11C 7/24 |
| | | | 714/718 |
| 2014/0189430 A1* | 7/2014 | Hilliges | G01R 31/2834 |
| | | | 714/27 |
| 2015/0066417 A1* | 3/2015 | Kimura | G11C 29/56 |
| | | | 702/123 |
| 2019/0303239 A1* | 10/2019 | Hsiao | G06F 3/0679 |

\* cited by examiner

| Lower physical programming unit | Center physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 10

MEMORY TESTING METHOD AND MEMORY TESTING SYSTEM

CROSS-REFERENCE TO RELATED APPLICATION

This application claims the priority benefit of Taiwan application Ser. No. 107129755, filed on Aug. 27, 2018. The entirety of the above-mentioned patent application is hereby incorporated by reference herein and made a part of this specification

BACKGROUND

Technical Field

The invention relates to a memory testing method and a memory testing system.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

In particular, when producing a storage device with a rewritable non-volatile memory module, the manufacturer of the storage device (or the supplier of the rewritable non-volatile memory module) may, for example, test and classify a large amount of rewritable non-volatile memory modules. For example, if a rewritable non-volatile memory module is to be used in a higher-level storage device (for example, a Solid-State Drive (SSD) or a storage device supporting PCIe, the rewritable non-volatile memory module needs to meet more strict conditions (e.g., the highest clock that the rewritable non-volatile memory module can support is above a specific threshold, and the number of damaged physical programming units is less than a specific threshold). In contrast, if a rewritable non-volatile memory module is to be used in a lower-level storage device (for example, a storage device of a Universal Serial Bus (USB) or a secure digital card (SD Card), the rewritable non-volatile memory module does not need to meet the strict conditions as described above.

In general, the testing process of determining whether a rewritable non-volatile memory module is applicable to a higher-level storage device and the testing process of determining whether a rewritable non-volatile memory module is applicable to a lower-level storage device are separate and independent. Therefore, how to integrate the two testing process mentioned-above to quickly and accurately determine which storage device that a rewritable non-volatile memory module is applicable to is one of the problems to be solved by those skilled in the art.

SUMMARY

The present invention provides a memory testing method and a memory testing system, which can integrate two memory controlling circuit units for testing a rewritable non-volatile memory module, thereby reducing the flow and time in testing and improving the efficiency of testing and classification to rewritable non-volatile memory modules.

The present invention provides a memory testing method for a memory testing system. The memory testing system includes a host system and a testing device. The host system includes a processor. The testing device is coupled to the host system and a rewritable non-volatile memory module. The memory testing method includes: testing, by a first memory controlling circuit unit corresponding to a first type memory storage device in the testing device, the rewritable non-volatile memory module to obtain first test information; testing, by a second memory controlling circuit unit corresponding to a second type memory storage device in the testing device, the rewritable non-volatile memory module according to the first test information to obtain second test information; and determining, by the processor, whether the rewritable non-volatile memory module is applicable to the second type memory storage device according to the first test information and the second test information, wherein the first type memory storage device is different from the second type memory storage device.

The present invention provides a memory testing system, includes: a host system and a testing device. The host system includes a processor. The testing device is coupled to the host system and a rewritable non-volatile memory module. The testing device comprises a first memory controlling circuit unit corresponding to a first type memory storage device and a second memory controlling circuit unit corresponding to a second type memory storage device. The first memory controlling circuit unit is configured to test the rewritable non-volatile memory module to obtain first test information. The second memory controlling circuit unit is configured to test the rewritable non-volatile memory module according to the first test information to obtain second test information. The processor is configured to determine whether the rewritable non-volatile memory module is applicable to the second type memory storage device according to the first test information and the second test information, wherein the first type memory storage device is different from the second type memory storage device.

Based on the above, the memory testing method and the memory testing system of the present invention may integrate two memory controlling circuit units for testing a rewritable non-volatile memory module. It may quickly and accurately determine which type of storage devices that a rewritable non-volatile memory module is applicable to, allow the two memory controlling circuit units to share test information, thereby reduce the flow and time in testing, and improve the efficiency of testing and classification to rewritable non-volatile memory modules.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 10 is a schematic diagram illustrating management of physical erasing units according to an exemplary embodiment.

DESCRIPTION OF THE EMBODIMENTS

Figure 1:
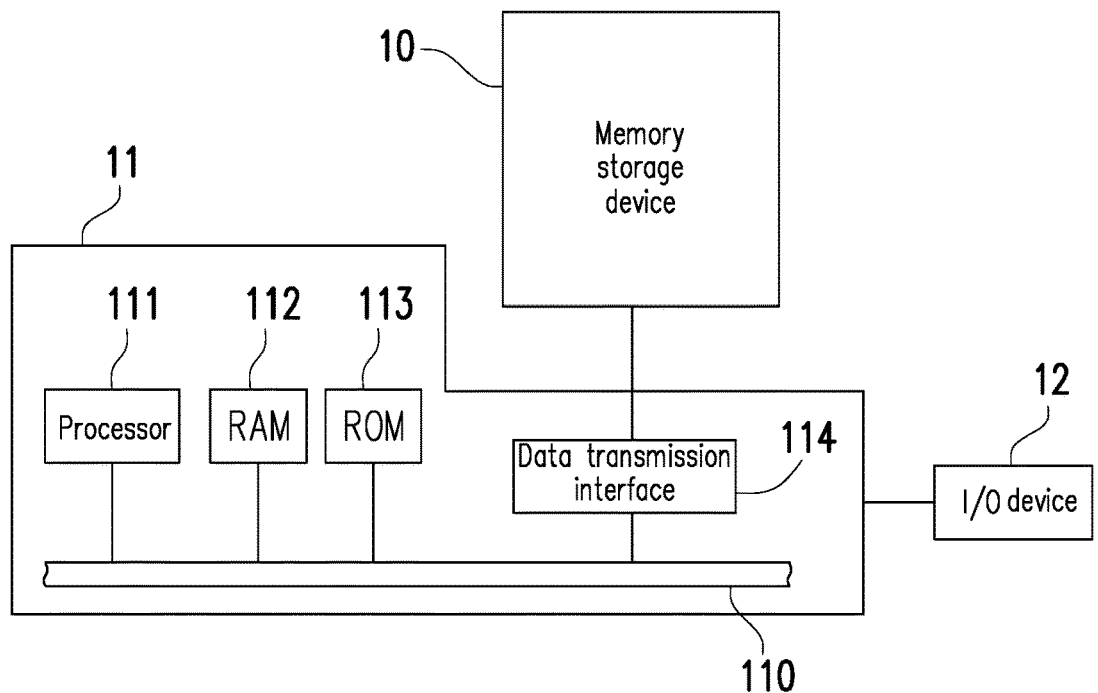
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
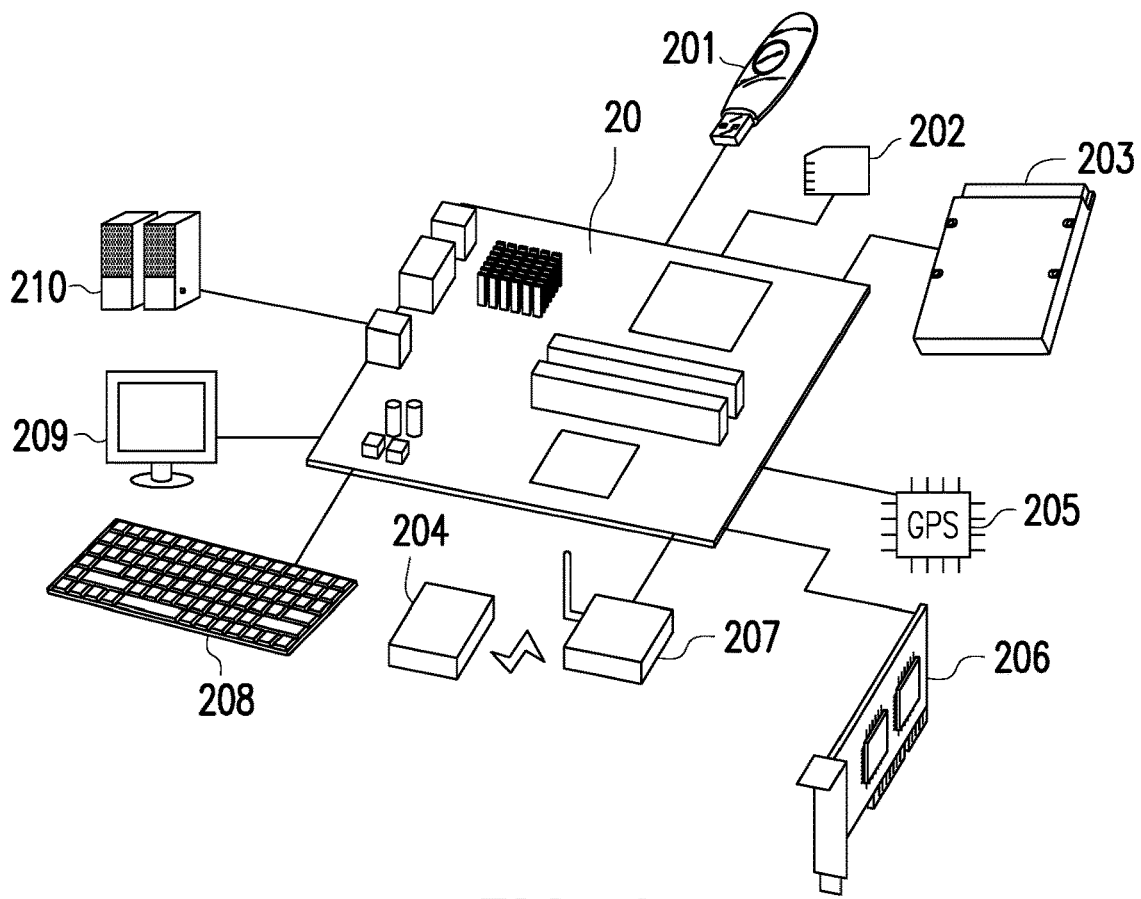
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
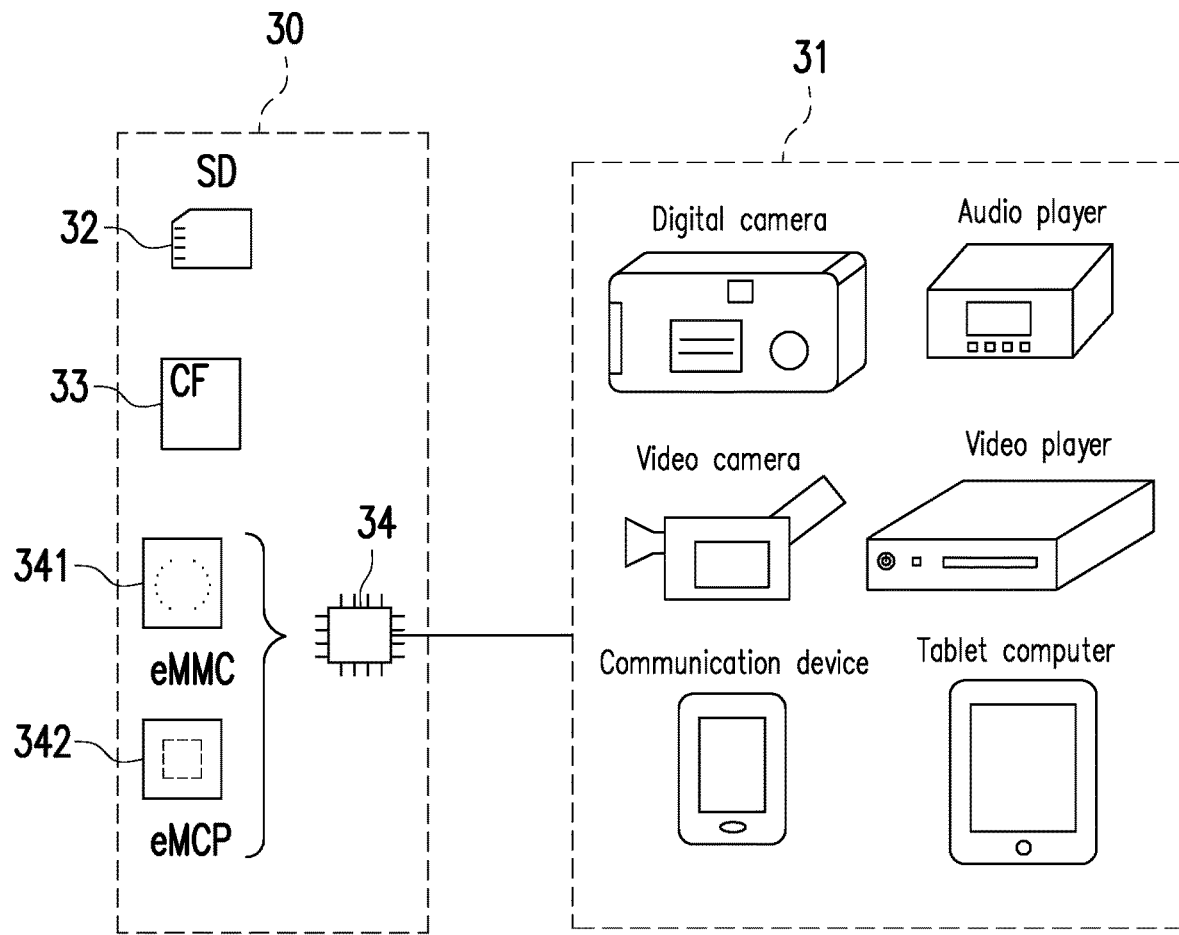
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in the foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system including a digital camera, a video camera, a communication device, an audio player, a video player or a tablet computer, and a memory storage device 30 may be various non-volatile memory storage devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
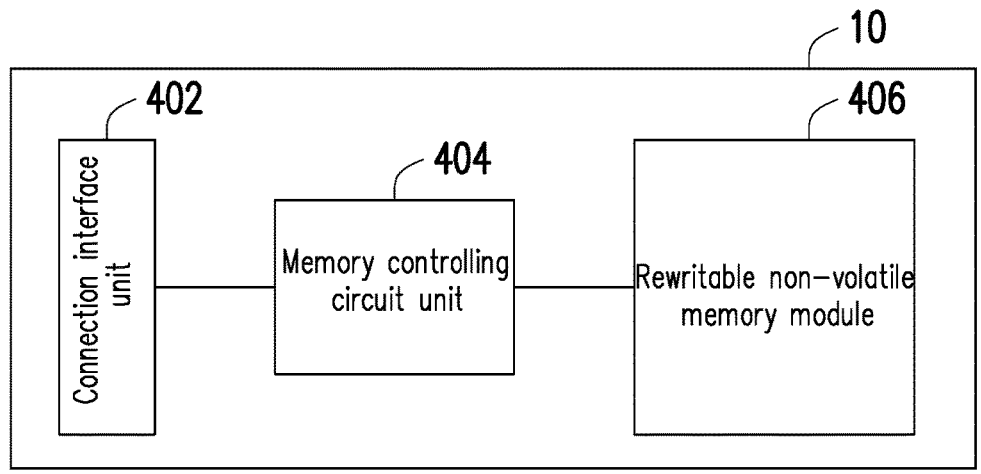
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory controlling circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the invention is not limited to the above. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD (Secure Digital) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form and perform operations, such as writing, reading or erasing data in the rewritable non-volatile memory module 406 according to the commands of the host system 11.

The rewritable non-volatile memory module 406 is coupled to the memory controlling circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

The memory cells in the rewritable non-volatile memory module 406 are disposed in an array. The memory cell array is described below using a two-dimensional array. However, it should be noted that, the following exemplary embodiment is simply an example of the memory cell array. In other exemplary embodiments, a disposition method of the memory cell array may be adjusted to satisfy actual requirements.

Figure 5:
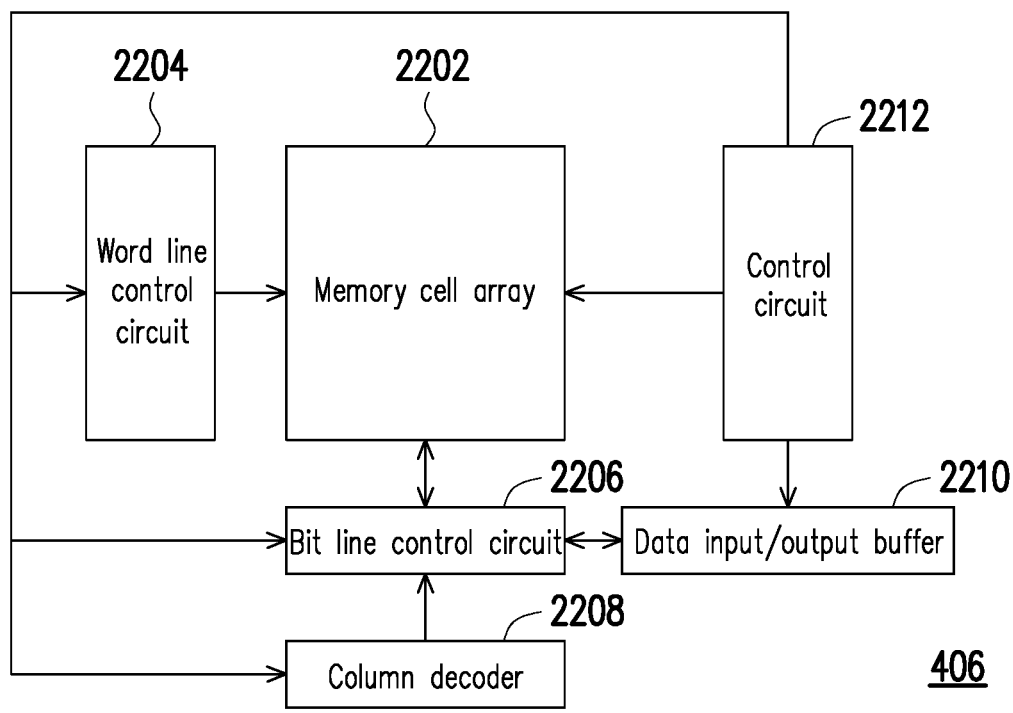
FIG. 5 is a schematic block diagram illustrating a rewritable non-volatile memory module according to an exemplary embodiment.
Figure 6:
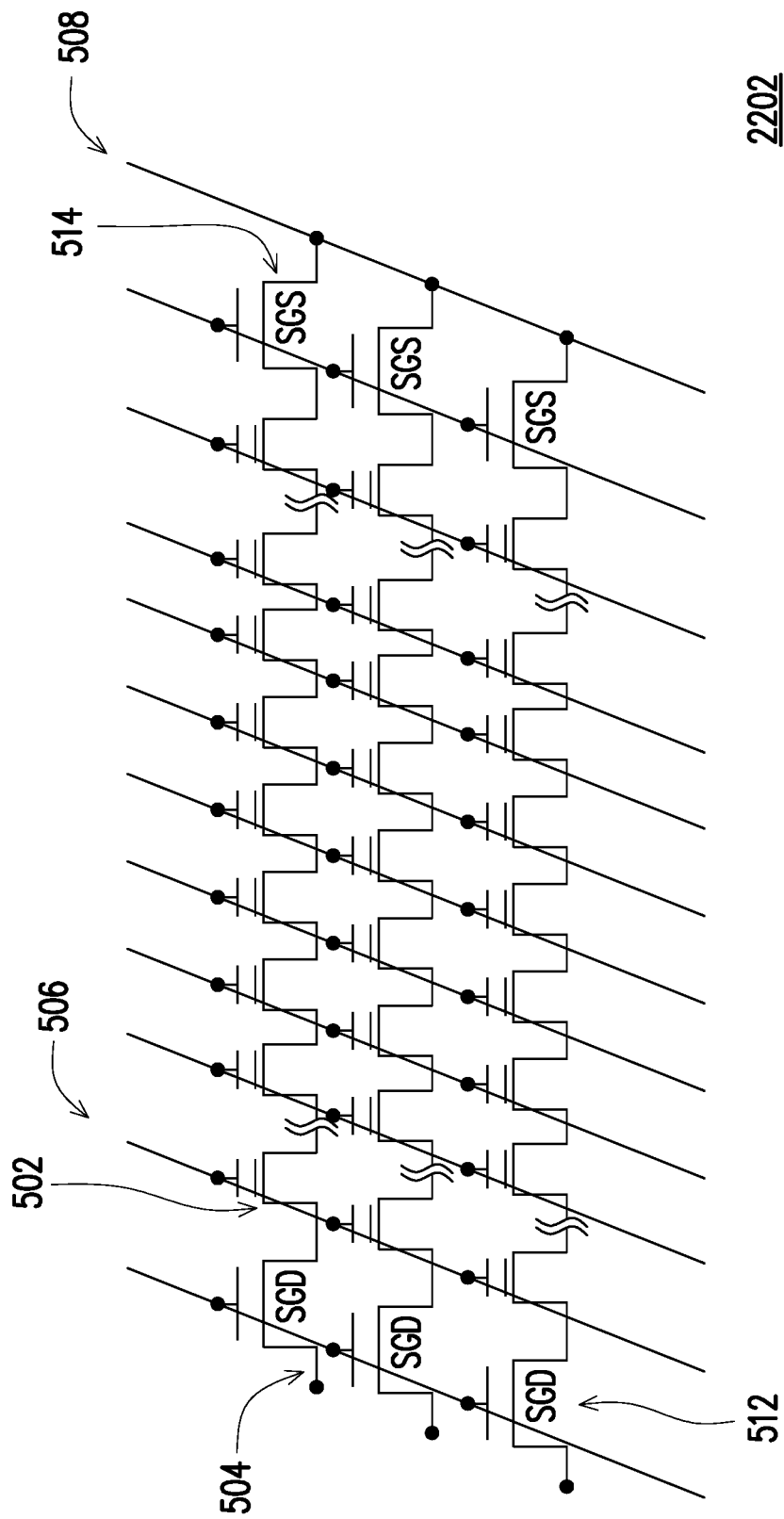
FIG. 6 is a schematic diagram illustrating a memory cell array according to an exemplary embodiment.

FIG. 5 is a schematic block diagram illustrating a rewritable non-volatile memory module according to an exemplary embodiment. FIG. 6 is a schematic diagram illustrating a memory cell array according to an exemplary embodiment.

Referring to FIG. 5 and FIG. 6 together, the rewritable non-volatile memory module 406 includes a memory cell array 2202, a word line control circuit 2204, a bit line control circuit 2206, a column decoder 2208, a data input/output buffer 2210 and a control circuit 2212.

In the present exemplary embodiment, the memory cell array 2202 may include a plurality of memory cells 502 used to store data, a plurality of select gate drain (SGD) transistors 512, a plurality of select gate source (SGS) transistors 514, as well as a plurality of bit lines 504, a plurality of word lines 506, a common source line 508 connected to the memory cells (as shown in FIG. 6). The memory cell 502 is disposed at intersections of the bit lines 504 and the word lines 506 in a matrix manner (or in a 3D stacking manner). If a write command or a read command is received from the memory controlling circuit unit 404, the control circuit 2212 controls the word line control circuit 2204, the bit line control circuit 2206, the column decoder 2208, the data input-output buffer 2210 to write the data into the memory cell array 2202 or read the data from the memory cell array 2202, wherein the word line control circuit 2204 is configured to control voltages applied to the word lines 506, the bit line control circuit 2206 is configured to control voltages applied to the bit lines 504, the column decoder 2208 is configured to select the corresponding bit line according to a row address in a command, and the data input/output buffer 2210 is configured to temporarily store the data.

The memory cell in the rewritable non-volatile memory module 406 may store multiple bits by changing a threshold voltage of one memory cell. More specifically, in each of the memory cells, a charge trapping layer is provided between a control gate and a channel. Amount of electrons in the charge trapping layer may be changed by applying a write voltage to the control gate thereby changing the threshold voltage of the memory cell. This process of changing the threshold voltage is also known as "writing data into the memory cell" or "programming the memory cell". Each of the memory cells in the memory cell array 2022 has a plurality of storage statuses depended on changes in the threshold voltage. A read voltage can be used to determine what storage state the memory cell belongs to, so as to obtain the bit stored by the memory cell.

Figure 7:
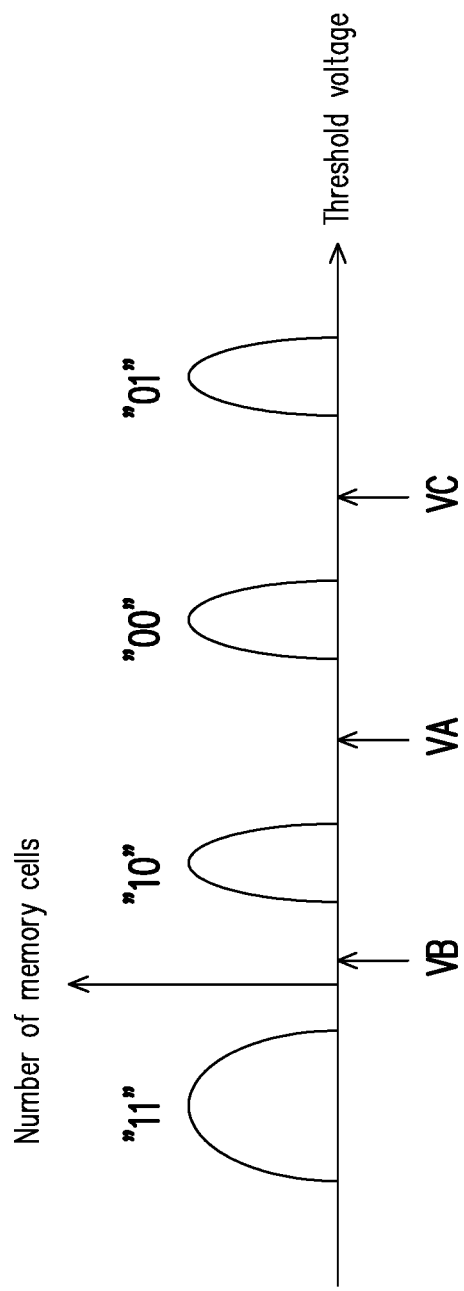
FIG. 7 is a histogram of a gate voltage corresponding to write data stored in the memory cell array according to an exemplary embodiment.

FIG. 7 is a histogram of a gate voltage corresponding to write data stored in the memory cell array according to an exemplary embodiment.

Referring to FIG. 7 that takes the MLC NAND flash memory for example, in which each of the memory cells has four storage states depending on different threshold voltages, and the storage states represent bits "11", "10", "00" and "01", respectively. In other words, each of the storage states includes a least significant bit (LSB) and a most significant bit (MSB). In the present exemplary embodiment, among the storage states (i.e., "11", "10", "00" and "01"), a first bit counted from the left is the LSB, and a second bit counted from the left is the MSB. Accordingly, in this exemplary embodiment, each of the memory cells can store two bits. It should be understood that, the threshold voltages and the corresponding storage states illustrated in the FIG. 7 are merely an example. In another exemplary embodiment of the invention, the threshold voltages and the corresponding storage states may also have an arrangement of "11", "10", "01" and "00" that is arranged according to the threshold voltage from small to large, or have other arrangements. In addition, in another exemplary embodiment, it can also be defined that the first bit counted from the left is the MSB, and the second bit counted from the left is the LSB.

In an exemplary embodiment where one memory cell is capable of storing multiple bits (e.g., the MLC or TLC flash memory module), the physical programming units belonging to the same word line may at least be classified into a lower physical programming unit and an upper physical programming unit. For instance, in the MLC NAND flash memory module, a least significant bit (LSB) of a memory cell belongs to the lower physical programming unit, and a most significant bit (MSB) of one memory cell belongs to the upper physical programming unit. In an exemplary embodiment, the lower physical programming unit is also known as a fast page, and the upper physical programming unit is also known as a slow page. In addition, in the TLC NAND flash memory module, a least significant bit (LSB) of a memory cell belongs to the lower physical programming unit, a center significant bit (CSB) of that memory cell belongs to a center physical programming unit, and a most significant bit (MSB) of that memory cell belongs to the upper physical programming unit.

Figure 8:
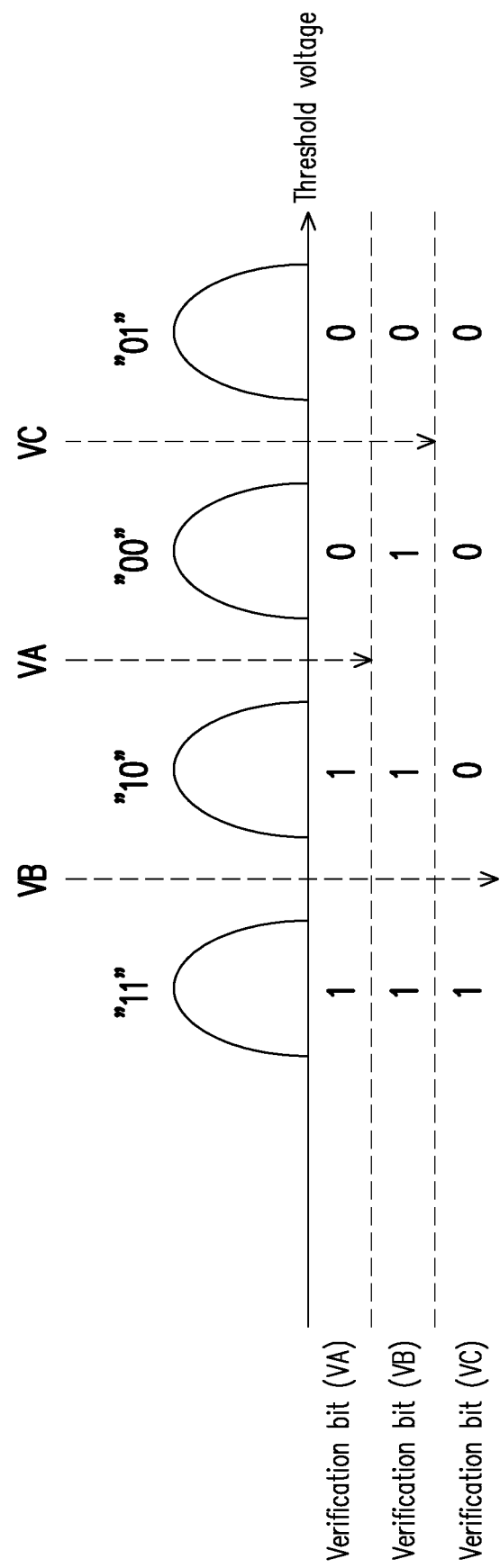
FIG. 8 illustrates a schematic diagram for reading data from a memory cell according to an exemplary embodiment.

FIG. 8 illustrates a schematic diagram for reading data from a memory cell according to an exemplary embodiment, in which a MLC NAND flash memory is used as an example.

Referring to FIG. 8, in a reading operation for the memory cells of the memory cell array 2202, read voltages VA to VC are applied to the control gate, and data stored in the memory cells are identified according whether the channel of the memory cell is turned on. A verification bit (VA) is configured to indicate whether the channel of the memory cell is turned on if a read voltage VA is applied; a verification bit (VC) is configured to indicate whether the channel of the memory cell is turned on if a read voltage VC is applied; and a verification bit (VB) is configured to indicate whether the channel of the memory cell is turned on if a read voltage VB is applied. Here, it is assumed that the corresponding memory cell channel is turned on if the verification bit is "1", and the corresponding memory cell channel is not turned on if the verification bit is "0". As shown in FIG. 8, the storage state of the memory cell may be determined according to the verification bits (VA) to (VC) so the bits stored can be obtained.

Figure 9:
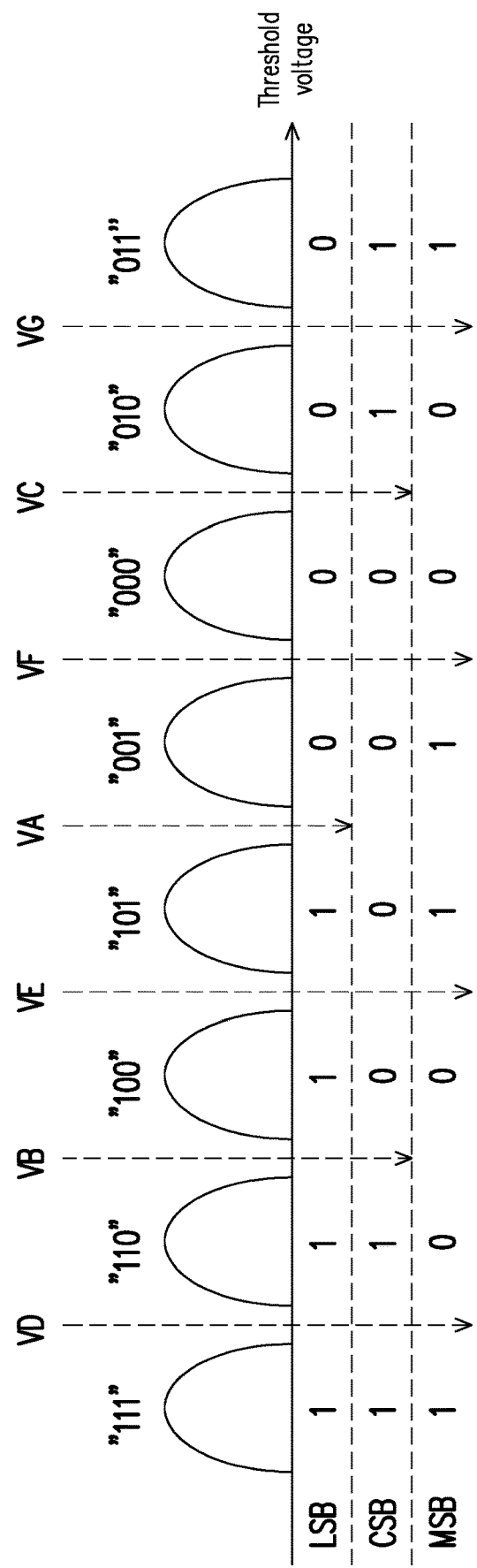
FIG. 9 illustrates a schematic diagram for reading data from a memory cell array according to another exemplary embodiment.

FIG. 9 illustrates a schematic diagram for reading data from a memory cell array according to another exemplary embodiment.

With reference to FIG. 9 that takes the TLC NAND flash memory for example, each of the storage states includes a first bit counted from the left being the least significant bit (LSB), a second bit counted from the left being a center significant bit (CSB) and a third bit counted from the left being the most significant bit (MSB). In this embodiment, the memory cell includes eight storage states depending on different threshold voltages (i.e., "111", "110", "100", "101", "001", "000", "010" and "011"). The bits stored in the memory cell may be identified by applying the read voltages VA to VC to the control gate.

Here, it should be noted that, an arranging sequence of the eight storage states in FIG. 9 may be decided based on manufacturer designs instead of being limited by the arranging sequence of this embodiment.

In addition, the memory cells of the rewritable non-volatile memory module 406 constitute a plurality of physical programming units, and the physical programming units constitute a plurality of physical erasing units. Specifically, the memory cells on the same word line in FIG. 6 constitute one or more of the physical programming units. For example, if the rewritable non-volatile memory module 406 is the MLC NAND flash memory module, the memory cells on intersections between the same word line and the bit lines constitute 2 physical programming units, i.e., the upper physical programming unit and the lower physical programming unit. In this case, one upper physical programming unit and one lower physical programming unit may be collectively referred to as a physical programming unit group. In particular, if data to be read is located in a lower physical programming unit of a physical programming unit group, the read voltage VA in FIG. 8 may be adopted to identify each bit value in the lower physical programming unit. If data to be read is located in an upper physical programming unit of a physical programming unit group, the read voltage VB and the read voltage VC in FIG. 8 may be adopted to identify each bit value in the upper physical programming unit.

Alternatively, if the rewritable non-volatile memory module 406 is the TLC NAND flash memory module, the memory cells on intersections between the same word line and the bit lines constitute 3 physical programming units, i.e., the upper physical programming unit, the center physical programming unit and the lower physical programming unit. In this case, one upper physical programming unit, one center physical programming unit and one lower physical programming unit may be collectively referred to as a physical programming unit group. In particular, if data to be read is located in a lower physical programming unit of a physical programming unit group, the read voltage VA in FIG. 9 may be adopted to identify each bit value in the lower physical programming unit. If data to be read is located in a center physical programming unit of a physical programming unit group, the read voltage VB and the read voltage VC in FIG. 9 may be adopted to identify each bit value in the center physical programming unit. If data to be read is located in an upper physical programming unit of a physical programming unit group, the read voltage VD, the read voltage VE and the read voltage VF and the read voltage VG in FIG. 9 may be adopted to identify each bit value in the upper physical programming unit.

In the present exemplary embodiment, the physical programming unit is the minimum unit for programming. That is, the physical programming unit is the minimum unit for writing data. For example, the physical programming unit is a physical page or a physical sector. If the physical programming unit is the physical page, these physical programming units usually include a data bit area and a redundancy bit area. The data bit area includes multiple physical sectors configured to store user data, and the redundant bit area is configured to store system data (e.g., an error correcting code). In this exemplary embodiment, the data bit area contains 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

FIG. 10 is a schematic diagram illustrating management of physical erasing units according to an exemplary embodiment.

With reference to FIG. 10, in the present exemplary embodiment, it is assumed that one physical erasing unit is constituted by a plurality of physical programming unit groups. Each of the physical programming unit groups includes the lower physical programming unit, the center physical programming unit and the upper physical programming unit constituted by multiple memory cells arranged on the same word line. For example, in the physical erasing unit, the 0-th physical programming unit belonging to the lower physical programming unit, the 1-st physical programming unit belonging to the center physical erasing unit and the 2-nd physical programming unit belonging to the upper physical programming unit are regarded as one physical programming unit group. Similarly, the 3-rd, the 4-th, and the 5-th physical programming units are regarded as one physical programming unit group, and by analogy, the other physical programming units are also grouped into multiple physical programming unit groups by the same method.

Figure 11:
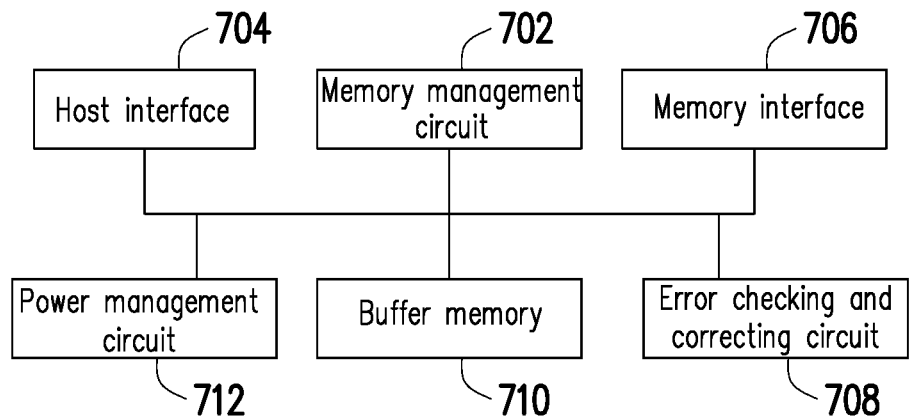
FIG. 11 is a schematic block diagram illustrating a memory controlling circuit unit according to an exemplary embodiment of the invention.

FIG. 11 is a schematic block diagram illustrating a memory controlling circuit unit according to an exemplary embodiment of the invention.

Referring to FIG. 11, the memory controlling circuit unit 404 includes a memory management circuit 702, a host interface 704, a memory interface 706 and an error checking and correcting circuit 708.

The memory management circuit 702 is configured to control overall operations of the memory controlling circuit unit 404. Specifically, the memory management circuit 702 has a plurality of control commands. If the memory storage device 10 operates, the control commands are executed to perform various operations such as data writing, data reading and data erasing. Hereinafter, description regarding operations of the memory management circuit 702 or any circuit element in the memory controlling circuit unit 404 is equivalent to description regarding operations of the memory controlling circuit unit 404.

In this exemplary embodiment, the control commands of the memory management circuit 702 are implemented in form of firmware. For instance, the memory management circuit 702 has a microprocessor unit (not illustrated) and a ROM (not illustrated), and the control commands are burned into the ROM. If the memory storage device 10 operates, the control commands are executed by the microprocessor to perform operations of writing, reading or erasing data.

In another exemplary embodiment, the control commands of the memory management circuit 702 may also be stored as program codes in a specific area (for example, the system area in a memory exclusively used for storing system data) of the rewritable non-volatile memory module 406. In addition, the memory management circuit 702 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 406 to the RAM of the memory management circuit 702 if the memory controlling circuit unit 404 is enabled. Then, the control commands are executed by the microprocessor unit to perform operations, such as writing, reading or erasing data.

Further, in another exemplary embodiment, the control commands of the memory management circuit 702 may also be implemented in a form of hardware. For example, the memory management circuit 702 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. The memory reading circuit is configured to give a read command sequence for the rewritable non-volatile memory module 406 in order to read data from the rewritable non-volatile memory module 406. The memory erasing circuit is configured to give an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 702 may further give command sequence of other types to the rewritable non-volatile memory module 406 for instructing to perform the corresponding operations.

The host interface 704 is coupled to the memory management circuit 702 and configured to receive and identify commands and data sent from the host system 11. In other words, the commands and data transmitted by the host system 11 are transmitted to the memory management circuit 702 via the host interface 704. In the present exemplary embodiment, the host interface 704 is compatible with the SATA standard. Nevertheless, it should be understood that the invention is not limited to the above. The host interface 704 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 706 is coupled to the memory management circuit 702 and configured to access the rewritable non-volatile memory module 406. In other words, data to be written into the rewritable non-volatile memory module 406 is converted into a format acceptable by the rewritable non-volatile memory module 406 via the memory interface 706. Specifically, if the memory management circuit 702 intends to access the rewritable non-volatile memory module 406, the memory interface 706 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 702 and transmitted to the rewritable non-volatile memory module 406 through the memory interface 706, for example. The command sequences may include one or more signals, or data transmitted in the bus. The signals or the data may include command codes and program codes. For example, information such as identification codes and memory addresses are included in the read command sequence.

The error checking and correcting circuit 708 is coupled to the memory management circuit 702 and configured to perform an error checking and correcting operation to ensure integrity of data. Specifically, if the memory management circuit 702 receives the write command from the host system 11, the error checking and correcting circuit 708 generates an ECC (error correcting code) and/or an EDC (error detecting code) for data corresponding to the write command, and the memory management circuit 702 writes data and the ECC and/or the EDC corresponding to the write command into the rewritable non-volatile memory module 406. Later, if reading the data from the rewritable non-volatile memory module 406, the memory management circuit 702 will read the corresponding ECC and/or the EDC, and the error checking and correcting circuit 708 will perform the error checking and correcting operation on the read data based on the ECC and/or the EDC.

In an exemplary embodiment, the memory controlling circuit unit 404 further includes a buffer memory 710 and a power management circuit 712.

The buffer memory 710 is coupled to the memory management circuit 702 and configured to temporarily store data and commands from the host system 11 or data from the rewritable non-volatile memory module 406. The power management unit 712 is coupled to the memory management circuit 702 and configured to control a power of the memory storage device 10.

Furthermore, in the present exemplary embodiment, the error checking and correcting circuit 708 can perform a single-frame encoding for the data stored in the same physical programming unit and can also perform a multi-frame encoding for data stored in multiple physical programming units. Each of the single-frame encoding and the multi-frame encoding may adopt encoding algorithms including at least one of a LDPC (low density parity code), a BCH code, a convolutional code or a turbo code. Alternatively, in another exemplary embodiment, the multi-frame encoding may also include a RS codes (Reed-solomon codes) algorithm or an XOR (exclusive OR) algorithm. Further, in another exemplary embodiment, more of other encoding algorithms not listed above may also be adopted, which are omitted herein. According to the adopted encoding algorithm, the error checking and correcting circuit 708 can encode the data to be protected, so as to generate the corresponding ECC and/or the EDC. For clear description, the ECC and/or the EDC generated by encoding are collectively referred to as encoded data.

Figure 12:
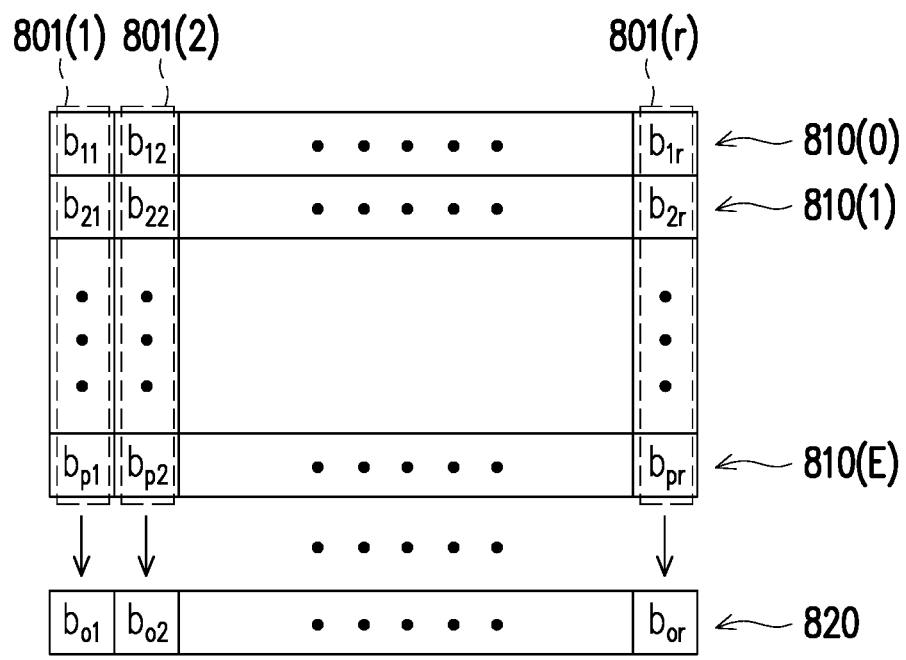
FIG. 12 is a schematic diagram illustrating a multi-frame encoding according to an exemplary embodiment of the invention.

FIG. 12 is a schematic diagram illustrating a multi-frame encoding according to an exemplary embodiment of the invention.

With reference to FIG. 12 that takes encoded data 820 correspondingly generated by encoding the data stored in physical programming units 810(0) to 810(E) as an example, in which at least a part of data stored by each of the physical programming units 810(0) to 810(E) may be regarded as one frame. In the multi-frame encoding, the data in the physical programming units 810(0) to 810(E) are encoded based on each of positions where bits (or bytes) are located. For example, bits $b_{11}$, $b_{21}$, ..., $b_{p1}$ at a position 801(1) are encoded as a bit $b_{p1}$ in the encoded data 820 and bits $b_{12}$, $b_{22}$, $b_{p2}$ at a position 801(2) are encoded as a bit $b_{or}$ in the encoded data 820; and by analogy, bits $b_{1r}$, $b_{2r}$, $b_{pr}$ at a position 801(r) are encoded as a bit $b_{or}$ in the encoded data 820. Later, the data read from the physical programming units 810(0) to 810(E) may be decoded according to the encoded data 820 so attempts on correcting possible errors in the read data can be made.

Herein, in another exemplary embodiment of FIG. 12, the data used for generating the encoded data 820 may also include redundancy bits corresponding to the data bits in the data stored in the physical programming units 810(0) to 810(E). Taking the data stored in the physical programming unit 810(0) for example, the redundancy bits therein are, for example, encoded data generated by performing the single-frame encoding for the data bits stored in the physical programming unit 810(0). In the present exemplary embodiment, it is assumed that if the data of the physical programming unit 810(0) is read, the data read from the physical programming unit 810(0) may be decoded by the redundancy bits (e.g., the encoded data generated by using the single-frame encoding) in the physical programming unit 810(0) so as to perform the error checking and correcting operation on the read data. However, if a failure occurs if a decoding is performed by using the redundancy bits in the physical programming unit 810(0) (e.g., a number of error bits of the data stored in the physical programming unit 810(0) is greater than a threshold), a retry-read mechanism may be used to select and use other read voltages so as to attempt reading correct data from the physical programming unit 810(0). If the correct data cannot be read from the physical programming unit 810(0) by using the retry-read mechanism, the encoded data 820 and data of the physical programming units 810(1) to 810(E) may be read and the decoding may be performed according to the encoded data 820 and the data of the physical programming units 810(1) to 810(E) so as to attempt correcting errors included in the data stored in the physical programming unit 810(0). In other words, in the present exemplary embodiment, if a failure occurs if the decoding is performed by using the encoded data generated by the single-frame encoding and a failure occurs if the reading is performed by using the retry-read mechanism, the encoded data generated by the multi-frame encoding is used for the decoding instead.

It is noted that in the following description, some terms may be replaced with corresponding abbreviations for ease of reading (see Table 1).

TABLE 1

| rewritable non-volatile memory module | RNVM module |
|---|---|
| physical erasing unit | PEU |
| physical programming unit | PPU |
| memory controlling circuit | MCC |
| error checking and correcting | ECC |

In particular, when producing the memory storage device 10 with the RNVM module 406, the manufacturer of the memory storage device 10 (or the supplier of the RNVM module 406) may, for example, test and classify a large amount of RNVM modules. For example, if a RNVM module is to be used in a higher-level storage device (for example, a Solid-State Drive (SSD) or a storage device supporting PCIe, the RNVM module needs to meet more strict conditions (e.g., the highest clock that the RNVM module can support is above a specific threshold, and the number of damaged PPUs is less than a specific threshold). In contrast, if a RNVM module is to be used in a lower-level storage device (for example, a storage device of a Universal Serial Bus (USB) or a secure digital card (SD Card), the RNVM module does not need to meet the strict conditions as described above.

In general, the testing process of determining whether a RNVM module is applicable to a higher-level storage device and the testing process of determining whether a RNVM module is applicable to a lower-level storage device are separate and independent. Therefore, how to integrate the two testing process to quickly and accurately determine which storage device that a RNVM module is applicable to is one of the problems to be solved by those skilled in the art.

Accordingly, the present invention provides a memory testing system and a memory testing method applied to the system. The system and the method can quickly and accurately determine which type of storage devices that a RNVM module is applicable to.

Figure 13:
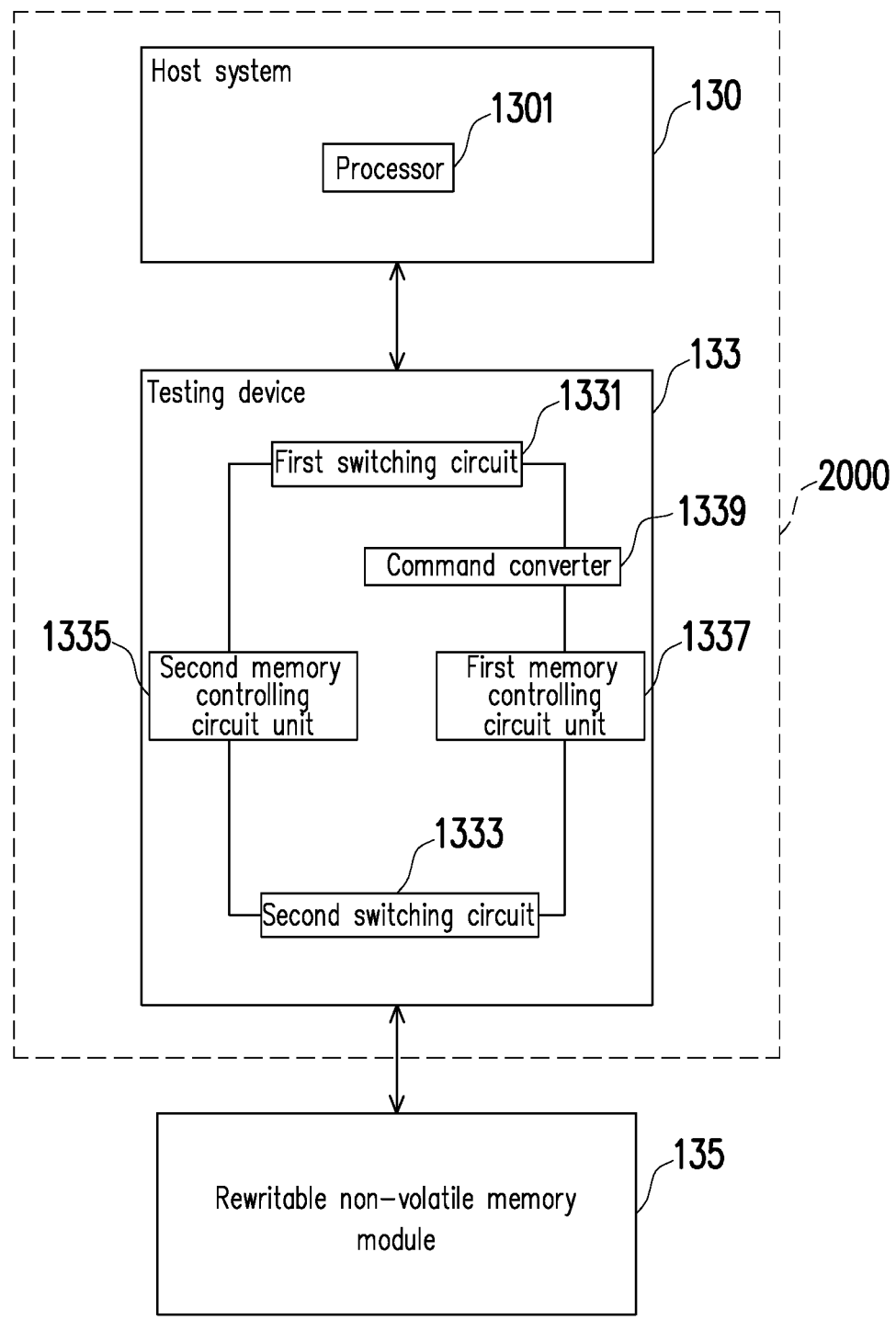
FIG. 13 is a schematic diagram of a memory testing system according to an exemplary embodiment of the invention.

In detail, FIG. 13 is a schematic diagram of a memory testing system according to an exemplary embodiment of the invention.

Referring to FIG. 13, the memory testing system 2000 includes a host system 130 and a testing device 133. The host system 130 includes a processor 1301. The processor 1301 is similar to the processor 111 of the host system 11 of the aforementioned FIG. 1. The processor 1301 can be a central processing unit (CPU), or other programmable general purpose or special purpose microprocessor, digital signal processor (DSP), programmable controller, application specific integrated circuit (ASIC) or other similar components or a combination of the components mentioned above.

It should be noted that, although not shown in FIG. 13, the host system 130 may also include the RAM 112, the ROM 113, the data transmission interface 114 and the system bus 110 of the host system 11 as shown in FIG. 1. That is, the host system 130 can be similar to the host system 11 of FIG. 1 and can have other additional components as well.

The testing device 133 includes a first switching circuit 1331, a second switching circuit 1333, a second MCC unit 1335, a first MCC unit 1337, and a command converter 1339. The second MCC unit 1335 is coupled to the first switching circuit 1331 and the second switching circuit 1333. The first MCC unit 1337 is coupled to the command converter 1339 and the second switching circuit 1333. The command converter 1339 is coupled to the first switching circuit 1331 and the first MCC unit 1337. The first switching circuit 1331 is coupled to the host system 130. The second switching circuit 1333 is coupled to the RNVM module 135 to be tested (or to be classified).

The first switching circuit 1331 and the second switching circuit 1333 can switch the loop in the testing device 133 according to commands issued from the host system 130 to cause the host system 130 to control the second MCC unit 1335 or the first MCC unit 1337 to test the RNVM module 135. For example, when the second MCC unit 1335 is to be used to test the RNVM module 135, the host system 130 can, for example, issue commands to a control circuit (not shown) in the testing device 133 such that the control circuit switches (or sets) the first switching circuit 1331 and the second switching circuit 1333 to a loop that enables the second MCC unit 1335 to issue commands to the RNVM module 135. Similarly, when the first MCC unit 1337 is to be used to test the RNVM module 135, the host system 130 can, for example, issue commands to a control circuit (not shown) in the testing device 133 such that the control circuit switches (or sets) the first switching circuit 1331 and the second switching circuit 1333 to a loop that enables the first MCC unit 1337 to issue commands to the RNVM module 135. The implementation manners of the first switching circuit 1331 and the second switching circuit 1333 can be known by the prior art, and are not described herein.

In addition, in the present exemplary embodiment, the host system 130 can issue commands that the second MCC unit 1335 can support to the second MCC unit 1335. The second MCC unit 1335 can, for example, test the RNVM module 135 according to commands issued by the host system 130. In addition, the host system 130 can issue commands that the second MCC unit 1335 can support to the command converter 1339. The command converter 1339 converts the received commands into commands that the first MCC unit 1337 can support. Thereafter, the first MCC unit 1337 provides the converted commands to the RNVM module 135 through the second switching circuit 1333 to test the RNVM module 135. However, the present invention is not limited thereto. In other embodiments, the testing device 133 may not include the command converter 1339. The host system 130 may, for example, issue commands that the first MCC unit 1337 can support to the first MCC unit 1337. The first MCC unit 1337, for example, can test the RNVM module 135 according to commands issued by the host system 130.

The internal structure of the second MCC unit 1335 and the first MCC unit 1337 may be similar to the aforementioned MCC unit 404. In the present exemplary embodiment, the second MCC unit 1335 corresponds to a second type memory storage device and the first MCC unit 1337 corresponds to a first type memory storage device. In the present exemplary embodiment, the second type memory storage device is, for example, a storage device of a universal serial bus (USB) or a Secure Digital Card (SD Card). The first type memory storage device is, for example, a solid state drive (SSD) or a memory storage device supporting PCIe. That is, the second MCC unit 1335 is mainly adapted to control the rewritable non-volatile memory in the second type memory storage device and the first MCC unit 1337 is mainly adapted to control the first type memory storage device. However, it should be noted that the present invention is not intended to limit the types of the first type memory storage device and the second type memory storage device.

In addition, the RNVM module 135 is a RNVM module similar to the RNVM module 406 described above, and thus will not be described herein.

Figure 14:
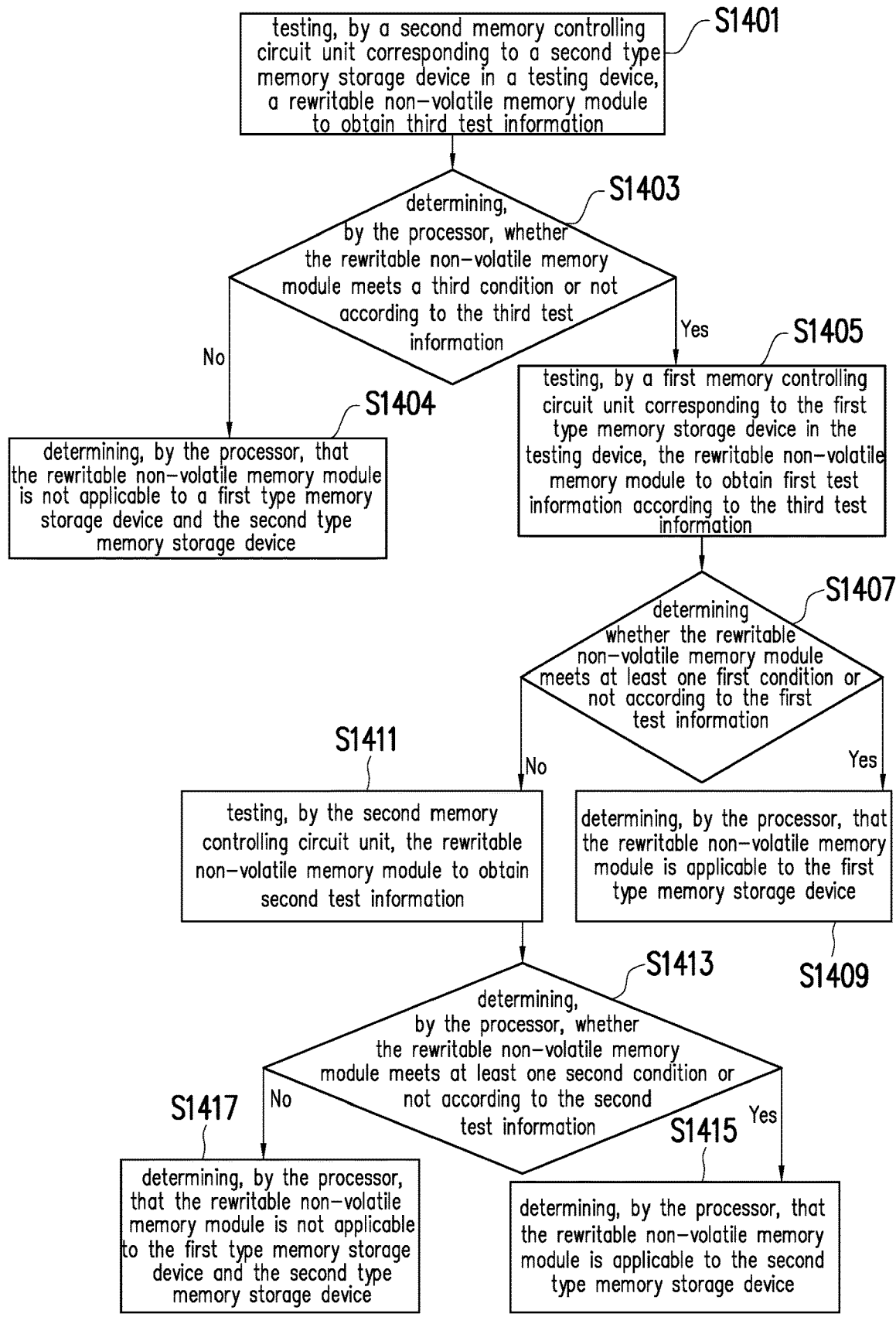
FIG. 14 is a flowchart of a memory testing method according to an exemplary embodiment of the invention.

FIG. 14 is a flowchart of a memory testing method according to an exemplary embodiment of the invention. The flowchart of FIG. 14 is applicable to the memory testing system 2000 of FIG. 13.

Please refer to FIG. 13 and FIG. 14 at the same time. First, the host system 130 can issue commands to the second MCC unit 1335. The second MCC unit 1335 provides corresponding commands to the RNVM module 135 to test the RNVM module 135 to obtain third test information according to commands issued by the host system 130 (step S1401).

In the present exemplary embodiment, the third test information may include a distribution location of at least one damaged PEU in the RNVM module 135. The distribution location is, for example, a location of a bit line in which the memory cells constituting the damaged PEU are disposed in the RNVM module 135. Alternatively, the distribution location of the at least one damaged PEU may also refer to a memory die in which the damaged PEU is located, which is not limited herein. In addition, the third test information may further include a quantity of the at least one damaged PEU or the highest clock that can be achieved by the RNVM module 135 during the second MCC unit 135 testing the RNVM module 135. Alternatively, the third test information may include an ECC code (a.k.a. a second ECC code) generated by an encoding operation (a.k.a. a second encoding operation) performed by the second MCC unit 1335 according to a clock (a.k.a. a second clock) and a data in a PPU (a.k.a. a second PPU) in the RNVM module 135. In the present exemplary embodiment, the second encoding operation is, for example, an encoding operation performed by using a coding algorithm of the BCH code. However, it should be noted that the present invention is not intended to limit the actual content of the third test information, and the third test information may also be one or a combination of the plurality of test information mentioned above.

After step S1401, the processor 1301 may determining whether the RNVM module 135 meets a third condition or not according to the third test information (step S1403). For example, the processor 1301 can determine, for example, whether the distribution location of the at least one damaged PEU mentioned above is located at a specific location in the RNVM module 135 or not. Alternatively, the processor 1301 may, for example, determine whether the quantity of the at least one damaged PEU is greater than a certain amount or not. Alternatively, the processor 1301 can determine, for example, whether the highest clock that can be achieved by the RNVM module 135 during the second MCC unit 135 testing the RNVM module 135 can achieve a specific clock or not. Alternatively, the processor 1301 may determine, for example, whether a decoded data obtained from decoding the data of the second PPU by the second MCC unit 1335 according to the second ECC code has an error bit that cannot be corrected or not.

It should be noted that each of the "damaged PEU" identified in step S1401 may be a PEU including a plurality of data, the decoded data obtained from decoding the plurality of data with a second decoding operation (for example, a decoding operation of the BCH algorithm) has error bits that cannot be corrected, and the amount of such data is greater than a specific threshold.

If it is determined that the RNVM module 135 does not meet the third condition according to the third test information, the processor 1301 determines that the RNVM module 135 is not applicable to the first type memory storage device and the second type memory storage device (step S1404). For example, if at least one of the following conditions is established: the distribution location of the at least one damaged PEU mentioned above is located at the specific location in the RNVM module 135, the quantity of the at least one damaged PEU is greater than the certain amount, the highest clock that can be achieved by the RNVM module 135 during the second MCC unit 135 testing the RNVM module 135 cannot achieve the specific clock and the decoded data obtained from decoding the data of the second PPU by the second MCC unit 1335 according to the second ECC code has an error bit that cannot be corrected, the processor 1301 determines that the RNVM module 135 does not meet the third condition according to the third test information and determines that the RNVM module 135 is not applicable to the first type memory storage device and the second type memory storage device. Thereafter, the host system 130 can output, for example, a determination result that the RNVM module 135 is not applicable to the first type memory storage device and the second type memory storage device, and the flow of FIG. 14 is ended.

However, if the processor 1301 determines that the RNVM module 135 meets the third condition according to the third test information, the host system 130 can issue commands to the first MCC unit 1337. The first MCC unit 1337 tests the RNVM module 135 according to the commands issued by the host system 130 and the third test information to obtain first test information (step S1405).

For example, if at least one of the following conditions is established: the distribution location of the at least one damaged PEU mentioned above is not located at the specific location in the RNVM module 135, the quantity of the at least one damaged PEU is less than the certain amount, the highest clock that can be achieved by the RNVM module 135 during the second MCC unit 135 testing the RNVM module 135 can achieve the specific clock and the decoded data obtained from decoding the data of the second PPU by the second MCC unit 1335 according to the second ECC code does not have an error bit that cannot be corrected, the processor 1301 determines that the RNVM module 135 meets the third condition according to the third test information.

In the present exemplary embodiment, the first test information includes, for example, at least one encoding information required when performing an encoding operation (a.k.a. a first encoding operation) by the first MCC unit 1337. For example, the first encoding operation is an encoding operation using the LDPC algorithm, and the at least one encoding information is, for example, related information (e.g., a value related to a soft bit or other parameter) in the LDPC algorithm. In addition, the first test information may further include an ECC code (a.k.a. a first ECC code) generated by the first encoding operation performed by the first MCC unit 1337 according to a clock (a.k.a. a first clock) and a data in a PPU (a.k.a. a first PPU). In particular, the first clock referred to herein is higher than the aforementioned second clock. However, it should be noted that the present invention is not intended to limit the actual content of the first test information, and the first test information may also be one or a combination of the plurality of test information mentioned above.

In particular, in the present embodiment, since the second MCC unit 1335 can identify the damaged PEU in the RNVM module 135 according to the aforementioned third test information (for example, the second ECC code) in step S1401, and in step S1405, the first MCC unit 1337 can also identify other damaged PEUs other than the at least one damaged PEU identified in step S1401 in the RNVM module 135 according to the third test information. Thereafter, the processor 1301 may record a mark corresponding to the other damaged PEU in a lookup table, and store the lookup table in the RNVM module 135. Thereafter, the contents of the lookup table can be used to perform statistics and analysis to the RNVM module 135, and then related values (e.g., yield) of the RNVM module 135 are known.

It should be noted that each of the "damaged PEU" identified in step S1405 may be a PEU including a plurality of data, the decoded data obtained from decoding the plurality of data with a first decoding operation (for example, a decoding operation of the LDPC algorithm) has error bits that cannot be corrected, and the amount of such data is greater than a specific threshold.

After obtaining the first test information, the processor 1301 may determine whether the RNVM module 135 meets at least one first condition according to the second test information (step S1407). For example, the processor 1301 can determine whether a decoding success rate can reach a specific threshold or not according to information related to the LDPC algorithm in the at least one encoding information. Alternatively, the processor 1301 may determine, according to the information related to the LDPC algorithm in the at least one encoding information, whether a decoded data obtained from decoding the data of the first PPU by the first MCC unit 1337 according to the first ECC code has an error bit that cannot be corrected or not, and then determine whether the RNVM module 135 meets the at least one first condition or not. However, the invention is not intended to limit the at least one first condition.

When the RNVM module 135 meets the at least one first condition, the processor 1301 determines that the RNVM module 135 is applicable to the first type memory storage device (step S1409). For example, if the processor 1301 determines, according to the information related to the LDPC algorithm in the at least one encoding information, that the decoding success rate can reach the specific threshold and/or the decoded data obtained from decoding the data of the first PPU by the first MCC unit 1337 according to the first ECC code does not have an error bit that cannot be corrected, the processor 1301 may determine that the RNVM module 135 meets the at least one first condition. Thereafter, the host system 1301 can output, for example, a determination result that the RNVM module 135 is applicable to the first type memory storage device.

However, when the RNVM module 135 does not meet the at least one first condition, the host system 130 can issue commands to the second MCC unit 1335 again. The second MCC unit 1335 tests the RNVM module 135 according to the commands issued by the host system 130 to obtain second test information (step S1411). For example, if the processor 1301 determines, according to the information related to the LDPC algorithm in the at least one encoding information, that the decoding success rate cannot reach the specific threshold and/or the decoded data obtained from decoding the data of the first PPU by the first MCC unit 1337 according to the first ECC code has an error bit that cannot be corrected, the processor 1301 may determine that the RNVM module 135 does not meet the at least one first condition.

In addition, after obtaining the second test information, the processor 1301 determines whether the RNVM module 135 meets the at least one second condition or not according to the second test information, (step S1413). For example, if the value (e.g., the decoding success rate) in the second test information reach the specific threshold and/or the second MCC unit 1335 can perform a specific function or achieve a specific performance (e.g., a specific clock rate) according to the information in the second test information, the processor 1301 determines that the RNVM module 135 meets the at least one second condition according to the second test information. On the other hand, when the value in the second test information does not achieve the threshold and/or the second MCC unit 1335 cannot perform the specific function or achieve the specific performance according to the information in the second test information, the processor 1301 determines that the RNVM module 135 does not meet the at least one second condition. The present invention is not intended to limit the actual content of the second test information and the at least one second condition.

When the processor 1301 determines that the RNVM module 135 meets the at least one second condition according to the second test information, the processor 1301 determines that the RNVM module 135 is applicable to the second type memory storage device (step S1415). Thereafter, the host system 130 can output, for example, a determination result that the RNVM module 135 is applicable to the second type memory storage device.

However, when the processor 1301 determines that the RNVM module 135 does not meet the at least one second condition according to the second test information, the processor 1301 determines that the RNVM module 135 is not applicable to the first type memory storage device and the second type memory storage device (step S1417). Thereafter, the host system 130 can output, for example, a determination result that the RNVM module 135 is not applicable to the first type memory storage device and the second type memory storage device.

It should be noted that a storage device (not shown) of the host system 130 can be used to store the aforementioned third test information and the first test information. The first MCC unit 1337 can obtain (in step S1405) the third test information obtained by testing the RNVM module 135 previously by the second MCC unit 1335 from the host system130. In addition, in steps S1411 to S1413, the second MCC unit 1335 can also obtain the first test information obtained by testing the RNVM module 135 previously by the first MCC unit 1337 from the host system130. The second MCC unit 1335 can know the related characteristics of the RNVM module 135 according to the first test information. Therefore, the second MCC unit 1335 and the first MCC unit 1337 can share test information of each other to achieve the purpose of data sharing.

For example, in an embodiment of the present invention, after the step S1401 is performed, it is assumed that the third test information includes four ECC codes (a.k.a. third ECC codes) generated after performing the second encoding operation (for example, an encoding algorithm of the BCH code) respectively to the four data (a.k.a. first data) in the RNVM module. Then, in step S1403, the second MCC unit 1335 may determine, according to the four third ECC codes, whether at least one of the four first data has an error bit that cannot be corrected or not. For example, the second MCC unit 1335 may decoding the four first data respectively according to the four third ECC codes to determine whether at least one of the four first data has an error bit that cannot be corrected or not after performing the decoding operation.

If the second MCC unit 1335 determines that at least one of the four first data has an error bit that cannot be corrected according to the four third ECC codes, in step S1405, the first MCC unit 1337 may perform the first encoding operation (i.e., an encoding operation using the LDPC algorithm) to the aforementioned four first data to generate a single ECC code (a.k.a. as a fourth ECC code), and determine, according to the fourth ECC code, whether one of the four first data has an error bit that cannot be corrected or not. That is to say, if the at least one first data has an error bit originally that cannot be corrected by the third ECC codes, the error bit may be corrected by the fourth ECC code. Therefore, the first MCC unit 1337 needs to generate the fourth ECC code for the first data to determine whether the at least one of the first data has an error bit that cannot be corrected by the fourth ECC code. It should be noted that, in this example, the clock for performing the second encoding operation is lower than the clock for performing the first encoding operation, and the ability of ECC of the ECC code generated by the first encoding operation is larger than the ability of ECC of the ECC code generated by the second encoding operation.

If the second MCC unit 1335 determines that at least one of the four first data does not have an error bit that cannot be corrected according to the four third ECC codes, in step S1405, the first MCC unit 1337 may not perform the step of performing the first encoding operation to the aforementioned four first data to generate the fourth ECC code and determining, according to the fourth ECC code, whether one of the four first data has an error bit that cannot be corrected or not. That is, if at least one of the first data does not have an error bit that cannot be corrected by the third ECC codes, at least one of the first data does not exist an error bits that cannot be corrected by the fourth ECC code. Therefore, it is no longer necessary for the first MCC unit 1337 to generate the fourth ECC code for the aforementioned first data for testing. In other words, by sharing the test information of each other between the second MCC unit 1335 and the first MCC unit 1337, the flow and the time of testing to the RNVM module can be reduced.

It should be noted that, in the exemplary embodiment, in step S1401, the second MCC unit 1335 may first perform preliminary testing to the PEUs in the RNVM module 135 to obtain the aforementioned third test information. The third test information is used to determine whether the RNVM module 135 satisfies "partial conditions" of all of the conditions required by the RNVM module which is applicable to the second type memory storage device. In an exemplary embodiment, the preliminary testing may be performed to all of the PEUs or a part of the PEUs in the RNVM module 135 to obtain the third test information. When the processor 1301 determines that the RNVM module 135 meets the third condition according to the third test information, it means that the RNVM module 135 satisfies the aforementioned "partial conditions". At this time, the first MCC unit 1337 may be used to test the RNVM module 135 according to the third test information to obtain the first test information in step S1405. If the first MCC unit 1337 tests all the PEUs in the RNVM module 135 to obtain the first test information, and the processor 1301 determines (in step S1407) that the RNVM module 135 meets the at least one first condition according to the first test information, the processor 1301 directly determines that the RNVM module 135 is applicable to the first type memory storage device in step S1409.

That is, if the PEUs in the RNVM module 135 meets the "partial conditions" of all of the conditions required by the RNVM module of the second type memory storage device, it can directly switch to use the first MCC unit 1337 to test the RNVM module 135 and determine whether the RNVM module 135 is applicable to the first type of memory storage device or not.

In particular, in the process of testing, by the first MCC unit 1337, the RNVM module 135 to obtain the first test information according to the third test information (i.e., in the process of step S1405), the processor 1301 may simultaneously perform the step of determining whether the RNVM module 135 meets the at least one first condition or not according to the first test information (i.e., step S1407). When it is determined that the RNVM module 135 does not meet the at least one first condition according to the first test information, the processor 1301 can immediately switch back to use the second MCC unit 1335 to test the RNVM module 135 (i.e., performing step S1411) in order to test whether the RNVM module 135 meets the remaining conditions, which are conditions other than the partial conditions mentioned above, of all of the conditions required by the RNVM module of the second type memory storage device, and further determine whether the RNVM module 135 is applicable to the second type memory storage device 1335 or not.

In other words, when the RNVM module 135 meets partial conditions required by the RNVM module in the second type memory storage device, it can be immediately switched to use the first MCC unit 1337 to test the RNVM module 135 to determine whether the RNVM module 135 meets the conditions required by the RNVM module in the first type memory storage device or not. In this way, it is not necessary to completely determine whether the RNVM module 135 is applicable to the second type memory storage device and then determine whether the RNVM module 135 is applicable to the first type memory storage device. Therefore, the memory testing system and the memory testing method of the present invention can classify the RNVM module 135 more quickly and efficiently.

It should be noted that, in an embodiment, the flow in FIG. 14 may also only perform steps S1405 to step S1417 without performing steps S1401 to S1404. In this embodiment, in step S1405, the first MCC unit 1335 can directly test the RNVM module 135 to obtain the first test information mentioned above and determine, in step S1407, whether the RNVM module 135 meets all the conditions required for the first type memory storage device. When the RNVM module 135 does not meet all the conditions required for the first type memory storage device, steps S1411 to S1417 are performed to determine whether the RNVM module 135 meets all the conditions required for the second type memory storage device. It should be noted that, in the present exemplary embodiment, the conditions required for the first type memory storage device are stricter than the conditions required for the second type memory storage device. For example, in terms of "the decoding success rate" in test items, the decoding success rate required for decoding data in the RNVM module applicable to the first type memory storage device needs to be greater than a first threshold, and the decoding success rate required for decoding data in the RNVM module applicable to the second type memory storage device needs to be greater than a second threshold. The first threshold is greater than the second threshold. For example, in terms of "the quantity of damaged PEUs" in test items, "the quantity of damaged PEUs" in the RNVM module of the first type memory storage device needs to be less than a third threshold, and "the quantity of damaged PEUs" in the RNVM module for the second type memory storage device needs to be less than a fourth threshold. The third threshold is less than the fourth threshold.

In summary, the memory testing method and the memory testing system of the present invention may integrate two MCC units for testing a RNVM module. It may quickly and accurately determine which type of storage devices that a RNVM module is applicable to, allow the two MCC units to share test information, thereby reduce the flow and time in testing, and improve the efficiency of testing and classification to RNVM modules.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory testing method for a memory testing system, the memory testing system includes a host system and a testing device, the host system comprises a processor, and the testing device is coupled to the host system and a rewritable non-volatile memory module, the memory testing method comprising:

transmitting, by the host system, commands supported by a second memory controlling circuit unit to the testing device;

converting, by a command converter of the testing device, the commands supported by the second memory controlling circuit unit into commands supported by a first memory controlling circuit unit;

testing, by a first memory controlling circuit unit corresponding to a first type memory storage device in the testing device, the rewritable non-volatile memory module to obtain first test information based on the converted commands supported by the first memory controlling circuit unit;

transmitting, by the testing device, the first test information to the second memory controlling circuit unit;

transmitting, by the host system, the commands supported by the second memory controlling circuit unit to the testing device;

testing, by the second memory controlling circuit unit corresponding to a second type memory storage device in the testing device, the rewritable non-volatile memory module according to the first test information to obtain second test information based on the commands supported by the second memory controlling circuit unit; and determining, by the processor, whether the rewritable non-volatile memory module is applicable to the second type memory storage device according to the first test information and the second test information, wherein the first type memory storage device is different from the second type memory storage device.

2. The memory testing method of claim 1, further comprising:

if it is determined according to the first test information that the rewritable non-volatile memory module does not meet at least one first condition and it is determined according to the second test information that the rewritable non-volatile memory module meets at least one second condition, determining, by the processor, that the rewritable non-volatile memory module is applicable to the second type memory storage device.

3. The memory testing method of claim 2, further comprising:

if it is determined according to the first test information that the rewritable non-volatile memory module does not meet the at least one first condition and it is determined according to the second test information that the rewritable non-volatile memory module does not meet the at least one second condition, determining, by the processor, that the rewritable non-volatile memory module is not applicable to the second type memory storage device.

4. The memory testing method of claim 1, wherein before the step of testing, by the first memory controlling circuit unit corresponding to the first type memory storage device in the testing device, the rewritable non-volatile memory module to obtain the first test information, the method further comprises:

testing, by the second memory controlling circuit unit corresponding to the second type memory storage device in the testing device, the rewritable non-volatile memory module to obtain third test information;

if it is determined according to the third test information that the rewritable non-volatile memory module meets a third condition, performing the step of testing, by the first memory controlling circuit unit corresponding to the first type memory storage device in the testing device, the rewritable non-volatile memory module to obtain the first test information according to the third test information; and if it is determined according to the third test information that the rewritable non-volatile memory module does not meet the third condition, determining, by the processor, that the rewritable non-volatile memory module is not applicable to the second type memory storage device.

5. The memory testing method of claim 4, wherein the rewritable non-volatile memory module comprises a plurality of physical erasing units, each of the plurality of physical erasing units comprises a plurality of physical programming units, the first test information comprises at least one of the at least one encoding information of a first encoding operation and a first error checking and correcting code generated by the first encoding operation performed by the first memory controlling circuit unit according to a first clock and a data in a first physical programming unit of the plurality of physical programming units.

6. The memory testing method of claim 5, wherein the third test information comprises at least one of a distribution location of at least one damaged physical erasing unit of the plurality of physical erasing units in the rewritable non-volatile memory module, a quantity of the at least one damaged physical erasing unit, a highest clock achieved by the rewritable non-volatile memory module during the second memory controlling circuit unit testing the rewritable non-volatile memory module and a second error checking and correcting code generated by a second encoding operation performed by the second memory controlling circuit unit according to a second clock and a data in a second physical programming unit of the plurality of physical programming units, wherein the first clock is higher than the second clock and the first encoding operation is different from the second encoding operation.

7. The memory testing method of claim 6, wherein the step of testing, by the first memory controlling circuit unit, the rewritable non-volatile memory module to obtain the first test information comprises:

identifying, by the first memory controlling circuit unit, other damaged physical erasing units other than the at least one damaged physical erasing unit in the plurality of physical erasing units according to the third test information; and recording, by the processor, a mark corresponding to the other damaged physical erasing unit in a lookup table and storing the lookup table in the rewritable non-volatile memory module.

8. The memory testing method of claim 4, wherein the third test information comprises a plurality of third error checking and correcting codes generated after performing a second encoding operation respectively to the plurality of first data in the rewritable non-volatile memory module by the second memory controlling circuit unit, the method further comprises:

determining, by the second memory controlling circuit unit, whether one of the plurality of first data has an error bit that cannot be corrected according to the plurality of third error checking and correcting codes;

if it is determined, by the second memory controlling circuit unit, according to the plurality of third error checking and correcting codes that one of the plurality of first data has the error bit that cannot be corrected, the step of testing, by the first memory controlling circuit unit, the rewritable non-volatile memory module to obtain the first test information comprises:

performing, by the first memory controlling circuit unit, a first encoding operation to the plurality of first data in the rewritable non-volatile memory module to generate a fourth error checking and correcting code, and determining whether one of the plurality of first data has the error bit that cannot be corrected according to the fourth error checking and correcting code;

if it is determined, by the second memory controlling circuit unit, according to the plurality of third error checking and correcting codes that one of the plurality of first data does not have the error bit that cannot be corrected, the step of testing, by the first memory controlling circuit unit, the rewritable non-volatile memory module to obtain the first test information comprises:

not performing the step of performing, by the first memory controlling circuit unit, the first encoding operation to the plurality of first data in the rewritable non-volatile memory module to generate the fourth error checking and correcting code, and determining whether one of the plurality of first data has the error bit that cannot be corrected according to the fourth error checking and correcting code.

9. The memory testing method of claim 1, wherein the testing device further comprises a first switching circuit and a second switching circuit, the first memory controlling circuit unit is coupled to the first switching circuit and the second switching circuit, the second memory controlling circuit unit is coupled to the first switching circuit and the second switching circuit, the first switching circuit is coupled to the host system and the second switching circuit is coupled to the rewritable non-volatile memory module.

10. The memory testing method of claim 9, wherein the first memory controlling circuit unit is coupled to the first switching circuit via the command converter.

11. The memory testing method of claim 1, wherein the first type memory storage device is a solid state drive (SSD) or a storage device supporting PCIe, and the second type of memory is a storage device of a universal serial bus (USB) or a Secure Digital Card (SD Card).

12. A memory testing system comprising:
a host system including a processor;
a testing device coupled to the host system and a rewritable non-volatile memory module, wherein the testing device comprises, a command converter, a first memory controlling circuit unit corresponding to a first type memory storage device and a second memory controlling circuit unit corresponding to a second type memory storage device,
wherein the host system is configured to transmit commands supported by a second memory controlling circuit unit to the testing device,
wherein the command converter is configured to convert the commands supported by the second memory controlling circuit unit into commands supported by a first memory controlling circuit unit,
wherein the first memory controlling circuit unit is configured to test the rewritable non-volatile memory module to obtain first test information based on the converted commands supported by the first memory controlling circuit unit,
wherein the testing device is configured to transmit the first test information to the second memory controlling circuit unit,
wherein the host system is configured to transmit the commands supported by the second memory controlling circuit unit to the testing device,
wherein the second memory controlling circuit unit is configured to test the rewritable non-volatile memory module according to the first test information to obtain second test information based on the commands supported by the second memory controlling circuit unit, and
wherein the processor is configured to determine whether the rewritable non-volatile memory module is applicable to the second type memory storage device according to the first test information and the second test information, wherein the first type memory storage device is different from the second type memory storage device.

13. The memory testing system of claim 12, wherein if it is determined according to the first test information that the rewritable non-volatile memory module does not meet at least one first condition and it is determined according to the second test information that the rewritable non-volatile memory module meets at least one second condition, the processor is further configured to determine that the rewritable non-volatile memory module is applicable to the second type memory storage device.

14. The memory testing system of claim 13, wherein if it is determined according to the first test information that the rewritable non-volatile memory module does not meet the at least one first condition and it is determined according to the second test information that the rewritable non-volatile memory module does not meet the at least one second condition, the processor is further configured to determine that the rewritable non-volatile memory module is not applicable to the second type memory storage device.

15. The memory testing system of claim 12, wherein before the operation of testing, by the first memory controlling circuit unit corresponding to the first type memory storage device in the testing device, the rewritable non-volatile memory module to obtain the first test information,
the second memory controlling circuit unit corresponding to the second type memory storage device in the testing device is further configured to test the rewritable non-volatile memory module to obtain third test information,
if it is determined according to the third test information that the rewritable non-volatile memory module meets a third condition, the first memory controlling circuit unit is further configured to perform the operation of testing the rewritable non-volatile memory module to obtain the first test information according to the third test information, and
if it is determined according to the third test information that the rewritable non-volatile memory module does not meet the third condition, the processor is further configured to determine that the rewritable non-volatile memory module is not applicable to the second type memory storage device.

16. The memory testing system of claim 15, wherein the rewritable non-volatile memory module comprises a plurality of physical erasing units, each of the plurality of physical erasing units comprises a plurality of physical programming units,
the first test information comprises at least one of the at least one encoding information of a first encoding operation and a first error checking and correcting code generated by the first encoding operation performed by the first memory controlling circuit unit according to a first clock and a data in a first physical programming unit of the plurality of physical programming units.

17. The memory testing system of claim 16, wherein the third test information comprises at least one of a distribution location of at least one damaged physical erasing unit of the plurality of physical erasing units in the rewritable non-volatile memory module, a quantity of the at least one damaged physical erasing unit, a highest clock achieved by the rewritable non-volatile memory module during the second memory controlling circuit unit testing the rewritable non-volatile memory module and a second error checking and correcting code generated by a second encoding operation performed by the second memory controlling circuit unit according to a second clock and a data in a second physical programming unit of the plurality of physical programming units,
wherein the first clock is higher than the second clock and the first encoding operation is different from the second encoding operation.

18. The memory testing system of claim 17, wherein in the operation of testing, by the first memory controlling circuit unit, the rewritable non-volatile memory module to obtain the first test information,
the first memory controlling circuit unit is further configured to identify other damaged physical erasing units other than the at least one damaged physical erasing unit in the plurality of physical erasing units according to the third test information, and
the processor is further configured to record a mark corresponding to the other damaged physical erasing unit in a lookup table and store the lookup table in the rewritable non-volatile memory module.

19. The memory testing system of claim 15, wherein the third test information comprises a plurality of third error checking and correcting codes generated after performing a second encoding operation respectively to the plurality of first data in the rewritable non-volatile memory module by the second memory controlling circuit unit,
the second memory controlling circuit unit is further configured to determine whether one of the plurality of first data has an error bit that cannot be corrected according to the plurality of third error checking and correcting codes,
if the second memory controlling circuit unit determines according to the plurality of third error checking and correcting codes that one of the plurality of first data has the error bit that cannot be corrected, in the operation of testing the rewritable non-volatile memory module to obtain the first test information,
the first memory controlling circuit unit is further configured to perform a first encoding operation to the plurality of first data in the rewritable non-volatile memory module to generate a fourth error checking and correcting code and determine whether one of the plurality of first data has the error bit that cannot be corrected according to the fourth error checking and correcting code,
if the second memory controlling circuit unit determines according to the plurality of third error checking and correcting codes that one of the plurality of first data does not have the error bit that cannot be corrected, in the operation of testing the rewritable non-volatile memory module to obtain the first test information,
the first memory controlling circuit unit does not perform the operation of performing the first encoding operation to the plurality of first data in the rewritable non-volatile memory module to generate the fourth error checking and correcting code and determining whether one of the plurality of first data has the error bit that cannot be corrected according to the fourth error checking and correcting code.

20. The memory testing system of claim 12, wherein the testing device further comprises a first switching circuit and a second switching circuit, the first memory controlling circuit unit is coupled to the first switching circuit and the second switching circuit, the second memory controlling circuit unit is coupled to the first switching circuit and the second switching circuit, the first switching circuit is coupled to the host system and the second switching circuit is coupled to the rewritable non-volatile memory module.

21. The memory testing system of claim 20, wherein the first memory controlling circuit unit is coupled to the first switching circuit via the command converter.

22. The memory testing system of claim 12, wherein the first type memory storage device is a solid state drive (SSD) or a storage device supporting PCIe, and the second type of memory is a storage device of a universal serial bus (USB) or a Secure Digital Card (SD Card).

* * * * *